United States Patent [19]
Hoshino

[11] Patent Number: 5,955,900
[45] Date of Patent: Sep. 21, 1999

[54] EQUIVALENT INDUCTANCE CIRCUIT HAVING A COMMON INPUT/OUTPUT TERMINAL

[75] Inventor: Koichi Hoshino, Tokyo, Japan

[73] Assignee: NEC Corporation, Tokyo, Japan

[21] Appl. No.: 08/877,646

[22] Filed: Jun. 17, 1997

[30] Foreign Application Priority Data

Jun. 17, 1996 [JP] Japan ..................................... 8-155767

[51] Int. Cl.⁶ .................................................. H03B 21/00
[52] U.S. Cl. ......................... 327/105; 327/478; 323/213
[58] Field of Search .................................... 333/213, 217; 327/105, 334, 478, 552

[56] References Cited

U.S. PATENT DOCUMENTS 4,873,499  10/1989  Algor .................................. 331/117 R
5,250,917  10/1993  Honda et al. ............................ 333/214
5,721,515   2/1998  Northan et al. ............................ 331/74

FOREIGN PATENT DOCUMENTS 35-14664  10/1960  Japan .
53-18362   2/1978  Japan ............................ H04M 11/00
4-329016  11/1992  Japan ............................. H03H 11/48
1587-622   8/1990  U.S.S.R. ................................. 333/213

Primary Examiner—Toan Tran
Attorney, Agent, or Firm—Foley & Lardner

[57] ABSTRACT

An equivalent inductance circuit having a common input/output terminal comprises a bipolar transistor having a base grounded, an input/output terminal connected to an emitter of the bipolar transistor, and a feedback path comprising a capacitance having one end connected to a collector of the bipolar transistor and the other end connected to the emitter.

5 Claims, 4 Drawing Sheets

EQUIVALENT INDUCTANCE CIRCUIT HAVING A COMMON INPUT/OUTPUT TERMINAL

BACKGROUND OF THE INVENTION

This invention relates to an equivalent inductance circuit having a function equivalent to an inductance and, in particular, to an equivalent inductance circuit which can be integrated.

Conventional equivalent inductance circuits of the type are disclosed in Japanese Unexamined Patent Publication (JP-A) No. 18362/75 (Reference 1) and Japanese Unexamined Patent Publication (JP-A) No. 329016/92 (Reference 2) and will hereafter be referred to as first and second conventional equivalent inductance circuits, respectively.

The first conventional equivalent inductance circuit comprises a first voltage-current conversion circuit connected to an Input terminal, an integration circuit connected to the first voltage-current conversion circuit, and a second voltage-current conversion circuit connected to the integration circuit and to the input terminal. In the first conventional equivalent inductance circuit, an input impedance substantially exhibits an inductance as seen from the input terminal.

On the other hand, the second conventional equivalent inductance circuit comprises a feed-back type integration circuit connected to an input terminal and a differential amplifier circuit connected to the feed-back type integration circuit and to the input terminal. In the second conventional equivalent inductance circuit, an input impedance substantially exhibits an inductance as seen from the input terminal.

However, each of the first and the second conventional equivalent inductance circuits described above has a disadvantage resulting from its large circuit scale.

Specifically, the first conventional equivalent inductance circuit requires the voltage-current conversion circuits while the second conventional equivalent inductance circuit requires the differential amplifier circuit. Thus, the circuit scale inevitably becomes large in either of the first and second conventional circuits.

Such a large circuit scale unfavorably results in large power consumption.

SUMMARY OF THE INVENTION

It is an object of this invention to provide an equivalent inductance circuit which has a simple circuit structure so as to reduce power consumption.

According to this invention, there is provided an equivalent inductance circuit having a common input/output terminal, comprising a bipolar transistor having a base grounded; an input/output terminal connected to an emitter of the bipolar transistor; and a feedback path comprising a capacitance having one end connected to a collector of the bipolar transistor and the other end connected to the emitter.

The above-mentioned equivalent inductance circuit may further comprises a second capacitance having one end connected to the base and the other end connected to either a level of a power supply or the ground, the base being connected to the ground for an a.c. signal.

The above-mentioned equivalent inductance circuit may further comprises a first resistance having one end connected to the emitter and the other end grounded; and a second resistance having one end connected to the collector and the other end provided with a level of a power supply.

The equivalent inductance circuit of this invention requires power consumption corresponding to a single bipolar transistor as will be understood from the above-mentioned structure. Thus, power consumption can be conendrably reduced.

DESCRIPTION OF THE PREFERRED EMBODIMENT

Figure 1:
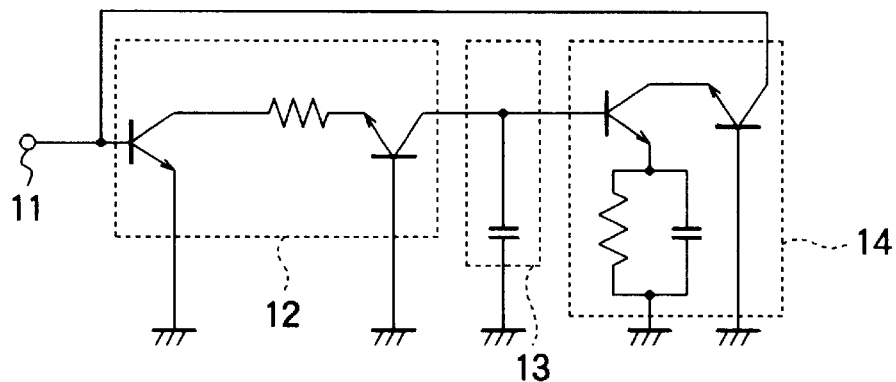
FIG. 1 shows a first conventional equivalent inductance circuit.

Prior to description of embodiments of this invention, first and second conventional equivalent inductance circuits will at first be described with reference to the drawing.

Reference to FIG. 1, the first conventional equivalent inductance circuit comprises a first voltage-current conversion circuit 12 connected to an input terminal 11, an integration circuit 13 connected to the first voltage-current conversion circuit 12, and a second voltage-current conversion circuit 14 connected to the integration circuit 13 and to the input terminal 11.

The first voltage-current conversion circuit 12 is supplied with an input voltage from the input terminal 11 and produces a first current proportional to the Input voltage. The integration circuit 13 is responsive to the first current and produces an integration output. The second voltage-current conversion circuit 14 is responsive to the integration output and converts the integration output into a second current. The second current is fed back to the input terminal 11.

In the first conventional equivalent Inductance circuit having the above-mentioned structure, an input impedance as seen from the input terminal substantially exhibits an inductance.

Figure 2:
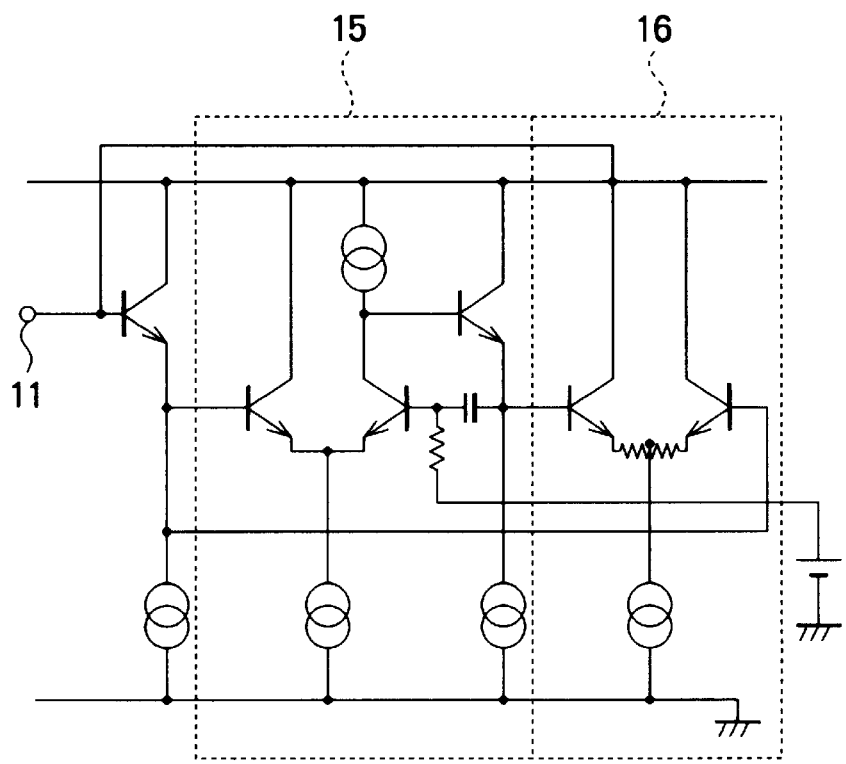
FIG. 2 shows a second conventional equivalent inductance circuit.

Reference to FIG. 2, the second conventional equivalent inductance circuit comprises a feed-back type integration circuit 15 connected to an Input terminal 11, and a differential amplifier circuit 16 connected to the feed-back type integration circuit 15 and to the input terminal 11.

The feed-back type integration circuit 15 is supplied with an input signal from the input terminal 11 and integrates the input signal to produce an integration output signal. The differential amplifier circuit 16 is supplied with the input signal and the integration output signal and produces a differential signal corresponding to a difference therebetween. The differential signal is fed back to the input terminal 11.

In the second conventional equivalent inductance circuit of the above-mentioned structure, an Input impedance as seen from the input terminal 11 substantially exhibits an inductance.

However, each of the first and the second conventional equivalent inductance circuit has a disadvantage that the circuit scale is large. This is because the voltage-current conversion circuits or the differential amplifier circuit must be included in the circuit structure.

Now, description will be made about an equivalent inductance circuit according to a first embodiment of this invention with reference to FIGS. 3 through 6.

Figure 3:
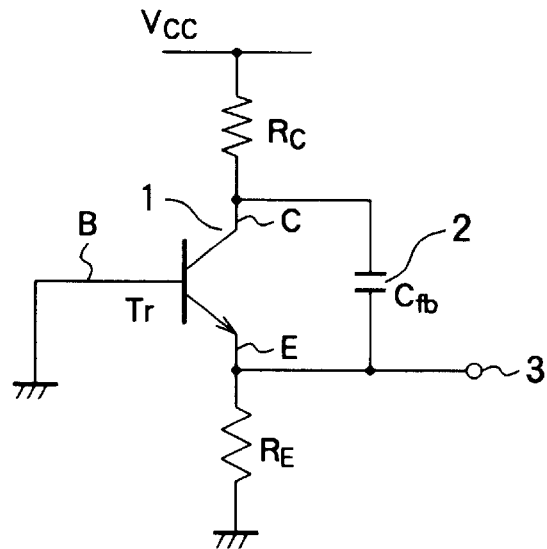
FIG. 3 shows an equivalent inductance circuit according to a first embodiment of this Invention.

Referring to FIG. 3, the equivalent inductance circuit according to the first embodiment of this invention comprises an amplifier circuit section 1 and a feed-back path 2. The amplifier circuit section 1 comprises a bipolar transistor Tr, a load resistance $R_C$, and a resistance $R_E$. The bipolar transistor Tr has a base B grounded for an a.c. signal, a collector C connected to a power supply through the load resistance $R_C$, and an emitter E grounded through the resistance $R_E$. The feed-back path 2 comprises a capacitance $C_{fb}$ and is connected between the collector C and the emitter E of the transistor Tr.

Figure 4:
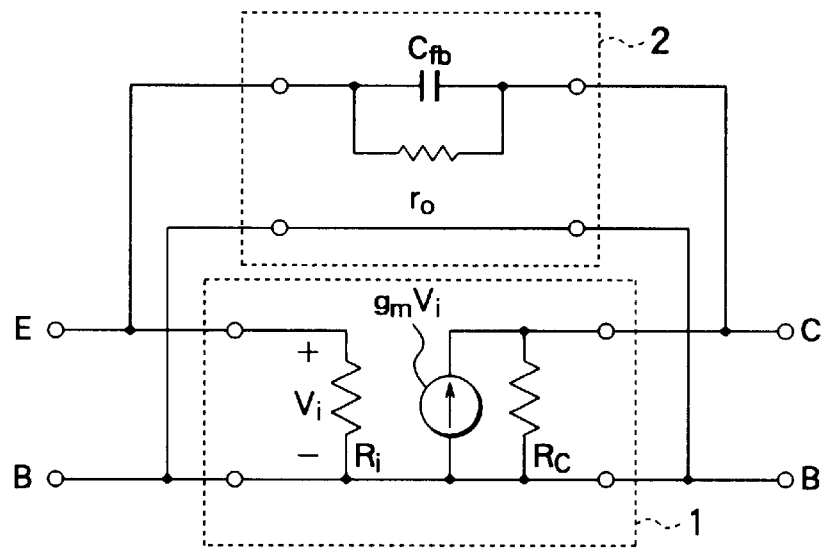
FIG. 4 is a small-signal equivalent circuit diagram of the equivalent inductance circuit in FIG. 3.

FIG. 4 shows a small-signal equivalent circuit of the equivalent Inductance circuit in this embodiment. Each of the amplifier circuit section 1 and the feed-back path 2 in FIG. 4 can be represented by Y parameters, as will later be described. An input resistance and an output resistance of the transistor Tr are represented by $R_i$ and $r_o$, respectively. A resultant impedance of a combination of the capacitance $C_{fb}$ and the output resistance $r_o$ is represented by $Z_f$.

The Y parameter related to the amplifier circuit section 1 is represented with a suffix "a" while the Y parameter related to the feed-back path 2 is represented with a suffix "f". Each of the Y parameters related to the amplifier circuit section 1 and the feed-back path 2 is represented by:

$$\begin{bmatrix} Y_{11a} & Y_{12a} \\ Y_{21a} & Y_{22a} \end{bmatrix} = \begin{bmatrix} \dfrac{1}{R_i} & 0 \\ -gm & \dfrac{1}{R_c} \end{bmatrix} \quad (1)$$

$$\begin{bmatrix} Y_{11f} & Y_{12f} \\ Y_{21f} & Y_{22f} \end{bmatrix} = \begin{bmatrix} \dfrac{1}{Z_f} & \dfrac{1}{Z_f} \\ -\dfrac{1}{Z_f} & \dfrac{1}{Z_f} \end{bmatrix}$$

Figure 5:
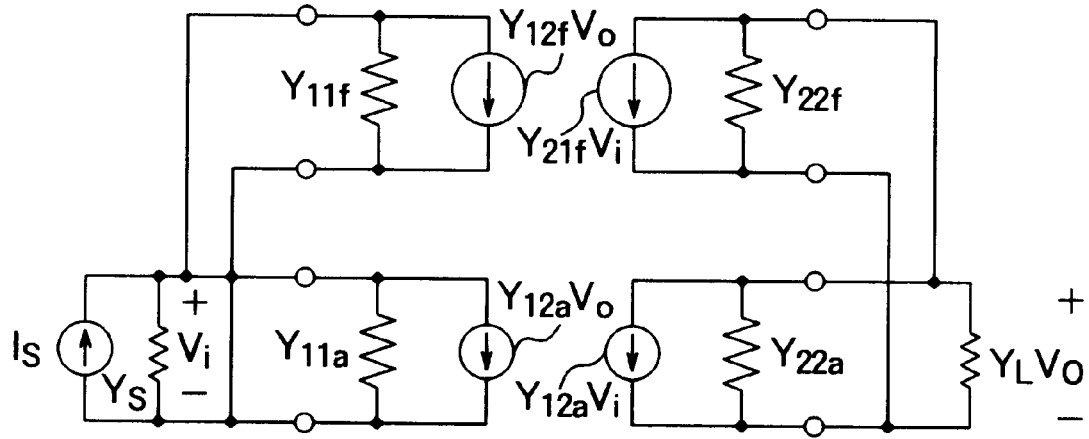
FIG. 5 is a small-signal equivalent circuit diagram of the equivalent inductance circuit in FIG. 3 with Y parameters.
Figure 6:
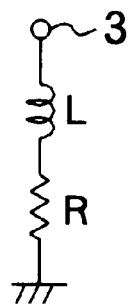
FIG. 6 is an equivalent circuit diagram of the circuit illustrated in FIG. 3.

Referring to FIG. 5, the circuit in FIG. 4 is represented as an equivalent circuit represented by the Y parameters according to Equations (1). In FIG. 5, $Y_S$ represents a terminal admittance and $Y_L$ represents a load admittance.

Herein, admittances $Y_i$ and $Y_o$ are defined by:

$$Y_i = Y_S + Y_{11a} + Y_{11f} \quad (2)$$

$$Y_o = Y_L + Y_{22a} + Y_{22f}$$

Referring to FIG. 5, an open loop gain a, a feed-back transfer function f, and a loop gain T are represented by the use of the admittances $Y_i$ and $Y_o$ as:

$$a = -\frac{Y_{21a} + Y_{21f}}{Y_i Y_o} \quad (3)$$

$$f = Y_{12a} + Y_{12f}$$

$$T = af = \left[\frac{-(Y_{21a} + Y_{21f})}{Y_i Y_o}\right][Y_{12a} + Y_{12f}]$$

Further referring to FIG. 5, an input impedance $Z_{in}$ is represented by:

$$Z_{in} = \frac{z_i}{1+T} \quad (4)$$

$$Z_i = \frac{1}{Y_i} = (Y_s + Y_{11a} + Y_{11f})^{-1}$$

As will be understood from Equations (1), the parameter $Y_{12a}$ is equal to 0. Therefore, the input impedance $Z_{in}$ is given from Equations (3) and (4) as:

$$Z_{in} = \left[Y_i + \left(-\frac{Y_{21a} + Y_{21f}}{Y_o}\right) \cdot Y_{12f}\right]^{-1} \quad (5)$$

Let an emitter resistance be represented by $r_e$. The resistance $R_E$ is assumed to be sufficiently large as compared with the emitter resistance $r_e$. In this event, the input resistance $R_i$ of the transistor Tr is equal to the emitter resistance $r_e$ ($R_i = r_e$). It is also assumed that the output resistance $r_o$ has a resistance value sufficiently large as compared with a resistance component of the capacitance $C_{fb}$. In this event, a resultant impedance $Z_f$ of a combination of the capacitance $C_{fb}$ and the output resistance $r_o$, is represented by $1/j\omega C_{fb}$.

Under the above-mentioned condition, $Y_i$, $Y_o$, $Y_{21f}$, $Y_{21a}$, and $Y_{12f}$ are represented by:

$$Y_i = Y_S + Y_{11a} + Y_{11f} = \frac{1}{Z_S} + \frac{1}{R_i} + \frac{1}{Z_f} \quad (6)$$

$$= \frac{1}{Z_S} + \frac{1}{r_e} + j\omega c_{fb}$$

$$Y_o = Y_L + Y_{22a} + Y_{22f} = \frac{1}{Z_L} + \frac{1}{R_c} + \frac{1}{Z_f}$$

$$= \frac{1}{Z_L} + \frac{1}{R_c} + j\omega c_{fb}$$

$$Y_{21a} = -g_m$$

$$Y_{21f} = Y_{12f} = -\frac{1}{Z_f} = -j\omega c_{fb}$$

$Z_S$ represents a terminal impedance and is given by $Z_S = 1/Y_S$ while $Z_L$ represents a load impedance and is given by $Z_L = 1/Y_L$.

For example, the Input impedance $Z_{in}$ is given by:

$$Z_{in} = 17.09 + j0.6869, \quad (7)$$

where the resistances $R_C = R_E = 1\,k\Omega$, the capacitance $C_{fb} = 1$ pF, a collector current $I_C = 1$ mA, and a frequency F = 10

MEz. In addition, the terminal impedance $Z_S$ is equal to 50Ω while the load impedance $Z_L$ is infinite (∞). Herein, $r_e$ has a typical value of about 26Ω while a mutual conductance $g_m$ is equal to 1/26 (at 25° C.) [S].

The input impedance $Z_{in}$ thus calculated corresponds to an input impedance in a circuit comprising a resistance R (=17.09 [Ω]) and an inductance L (=10.9 nH) connected in series. In this manner, the circuit illustrated in FIG. 3 is equivalently converted into the circuit illustrated in FIG. 6.

In the equivalent Inductance circuit according to this embodiment of the above-mentioned structure, power consumption corresponds to a single transistor and is much reduced as compared with the first and the second conventional circuits.

Figure 7:
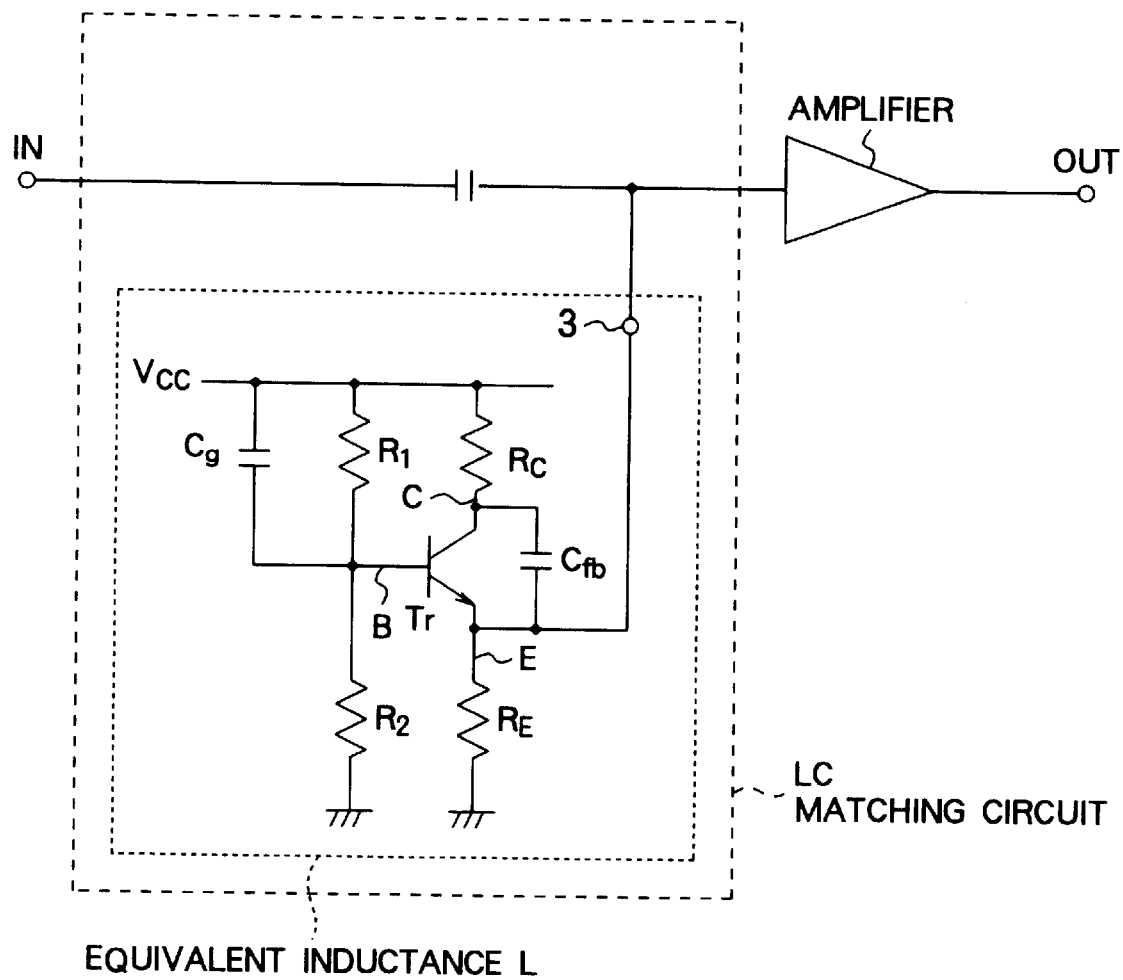
FIG. 7 shows a circuit to which an equivalent inductance circuit according to a second embodiment of this invention is applied.

Referring to FIG. 7, an equivalent inductance circuit according to a second embodiment of this invention is applied to an LC matching circuit located at a preceding stage of an amplifier. The equivalent inductance circuit exhibits an equivalent Inductance L in the LC matching circuit.

As illustrated in FIG. 7, the equivalent inductance circuit of this embodiment comprises a bipolar transistor Tr, a capacitance $C_{fb}$ serving as a feedback path, a capacitance $C_g$ grounding a base B of the bipolar transistor Tr for an a.c. signal, a resistance $R_E$, a load resistance $R_C$, and first and second bias resistances $R_1$ and $R_2$.

The bipolar transistor Tr has a collector C connected to a power supply $V_{cc}$ through the load resistance $R_C$, and an emitter E grounded through the resistance $R_E$. The capacitance $C_{fb}$ has one end connected to the collector C and the other end connected to the emitter E. The first and the second bias resistances $R_1$ and $R_2$ form a current feedback bias circuit for stabilizing the emitter current. The first bias resistance $R_1$ has one end connected to the power supply $V_{cc}$ and the other end connected to the base of the bipolar transistor Tr. The second bias resistance $R_2$ has one end connected to the base of the bipolar transistor Tr and the other end grounded. The capacitance $C_g$ has one end connected to the base B of the bipolar transistor Tr and the other end connected to the power supply $V_{cc}$ and serves to ground the base for an a.c. signal as described above. The other end of the capacitance $C_g$ may be grounded Instead.

As described above, the equivalent inductance circuit according to the second embodiment has the bias circuit and the base B of the bipolar transistor Tr is grounded for an a.c. signal by the capacitance $C_g$. Therefore, the equivalent inductance circuit achieves a stable inductance value as compared with the first embodiment. The equivalent inductance circuit of the second embodiment has current consumption as low as about ImA. Thus, the equivalent inductance circuit remarkably saves the current consumption.

It will be understood that the equivalent inductance circuit of this embodiment is applicable to any semiconductor integrated circuit which requires an inductance.

As described above, It is possible according to this invention to obtain the equivalent inductance circuit in which low power consumption is realized.

What is claimed is:

1. An equivalent inductance circuit having a common input/output terminal, comprising:

a bipolar transistor having a base grounded;

an input/output terminal directly connected to an emitter of said bipolar transistor; and a feedback path comprising a capacitance having one end directly connected to a collector of said bipolar transistor and the other end directly connected to said emitter.

2. An equivalent inductance circuit as claimed in claim 1, further comprising:

a first resistance having one end connected to said emitter and the other end grounded; and a second resistance having one end connected to said collector and the other end provided with a level of a power supply.

3. An equivalent inductance circuit having a common input/output terminal, comprising:

a bipolar transistor having a base grounded;

an input/output terminal connected to an emitter of said bipolar transistor; and a feedback path comprising a capacitance having one end connected to a collector of said bipolar transistor and the other end connected to said emitter, said inductor circuit, said circuit further comprising a second capacitor having one end connected to the base and the other end connected to one of a power supply ground, said base being coupled to the ground for an a.c. signal.

4. An equivalent inductance circuit having a common input/output terminal, comprising:

a bipolar transistor having a base grounded;

an input/output terminal connected to an emitter of said bipolar transistor;

a feedback path comprising a capacitance having one end connected to a collector of said bipolar transistor and the other end connected to said emitter;

a first resistance having one end connected to said emitter and the other end grounded;

a second resistance having one end connected to said collector and the other end provided with a level of a power Supply;

a second capacitor having one end connected to the base and the other end connected to one of a power supply ground, said base being coupled to the ground for an a.c. signal.

5. An equivalent inductance circuit as claimed in claim 4, further comprising a first bias resistor having one end connected to said base and the other end provided with the level of the power supply; and a second bias resistor having one end connected to said base and the other end provided with the level of the ground.

* * * * *